US012719032B2

(12) United States Patent
Tanaka

(10) Patent No.: US 12,719,032 B2
(45) Date of Patent: Aug. 25, 2026

(54) PLASMA PROCESSING METHOD AND PLASMA PROCESSING APPARATUS

(71) Applicant: Tokyo Electron Limited, Tokyo (JP)

(72) Inventor: Ikko Tanaka, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 216 days.

(21) Appl. No.: 18/598,743

(22) Filed: Mar. 7, 2024

(65) Prior Publication Data

US 2024/0213002 A1 Jun. 27, 2024

Related U.S. Application Data

(63) Continuation of application No. PCT/JP2023/000475, filed on Jan. 11, 2023.

(30) Foreign Application Priority Data

Jan. 31, 2022 (JP) ................................ 2022-012670

(51) Int. Cl.
*H01J 37/32* (2006.01)

(52) U.S. Cl.
CPC .. *H01J 37/32862* (2013.01); *H01J 37/32128* (2013.01); *H01J 37/32146* (2013.01); *H01J 37/32449* (2013.01); *H01J 2237/334* (2013.01)

(58) Field of Classification Search
CPC .......... H01J 37/32091; H01J 37/32128; H01J 37/32146; H01J 37/32449; H01J 37/32706; H01J 37/32715; H01J 37/32862; H01J 2237/334; H05H 1/46; H10P 50/242; H01L 21/3065
See application file for complete search history.

(56) References Cited

U.S. PATENT DOCUMENTS

2020/0266036 A1* 8/2020 Aoki ................ H01J 37/32146
2021/0074524 A1 3/2021 Koshimizu

FOREIGN PATENT DOCUMENTS

JP 2019-036658 A 3/2019

* cited by examiner

*Primary Examiner* — Benjamin Kendall
(74) *Attorney, Agent, or Firm* — Studebaker Brackett PLLC

(57) ABSTRACT

A plasma processing method includes (a) placing a substrate onto a substrate support surface of a substrate support in a chamber in a plasma processing apparatus. The plasma processing method further includes (b) etching a film on the substrate with plasma. The plasma processing method further includes (c) cleaning the chamber with plasma. In (b) and (c), a bias voltage including a pulse of a direct current voltage and having a pulse waveform is cyclically applied to a bias electrode in the substrate support. The bias voltage has a bias frequency being an inverse of a duration of a waveform cycle of the pulse waveform. The bias frequency is higher in (c) than in (b).

13 Claims, 5 Drawing Sheets

PLASMA PROCESSING METHOD AND PLASMA PROCESSING APPARATUS

CROSS-REFERENCE TO RELATED APPLICATIONS

This application is a continuation application of PCT Application No. PCT/JP2023/000475, filed on Jan. 11, 2023, which claims the benefit of priority from Japanese Patent Application No. 2022-012670, filed on Jan. 31, 2022. The entire contents of the above listed PCT and priority applications are incorporated herein by reference.

BACKGROUND

Field

Exemplary embodiments of the disclosure relate to a plasma processing method and a plasma processing apparatus.

Description of the Related Art

A plasma processing apparatus is used to etch a film on a substrate. When a film on a substrate is etched with a plasma processing apparatus, byproducts form on surfaces inside the chamber. The byproducts are removed through cleaning of the chamber. Such cleaning of a chamber is described in Japanese Unexamined Patent Application Publication No. 2019-36658.

SUMMARY

A plasma processing method according to one exemplary embodiment includes (a) placing a substrate onto a substrate support surface of a substrate support in a chamber in a plasma processing apparatus. The plasma processing method further includes (b) etching a film on the substrate with plasma generated from an etching gas in the chamber. The plasma processing method further includes (c) cleaning the chamber with plasma generated from a cleaning gas in the chamber. In (b) and (c), a bias voltage including a pulse of a direct current voltage and having a pulse waveform is cyclically applied to a bias electrode in the substrate support. The bias voltage has a bias frequency being an inverse of a duration of a waveform cycle of the pulse waveform. The bias frequency is higher in (c) than in (b).

DETAILED DESCRIPTION

Figure 1:
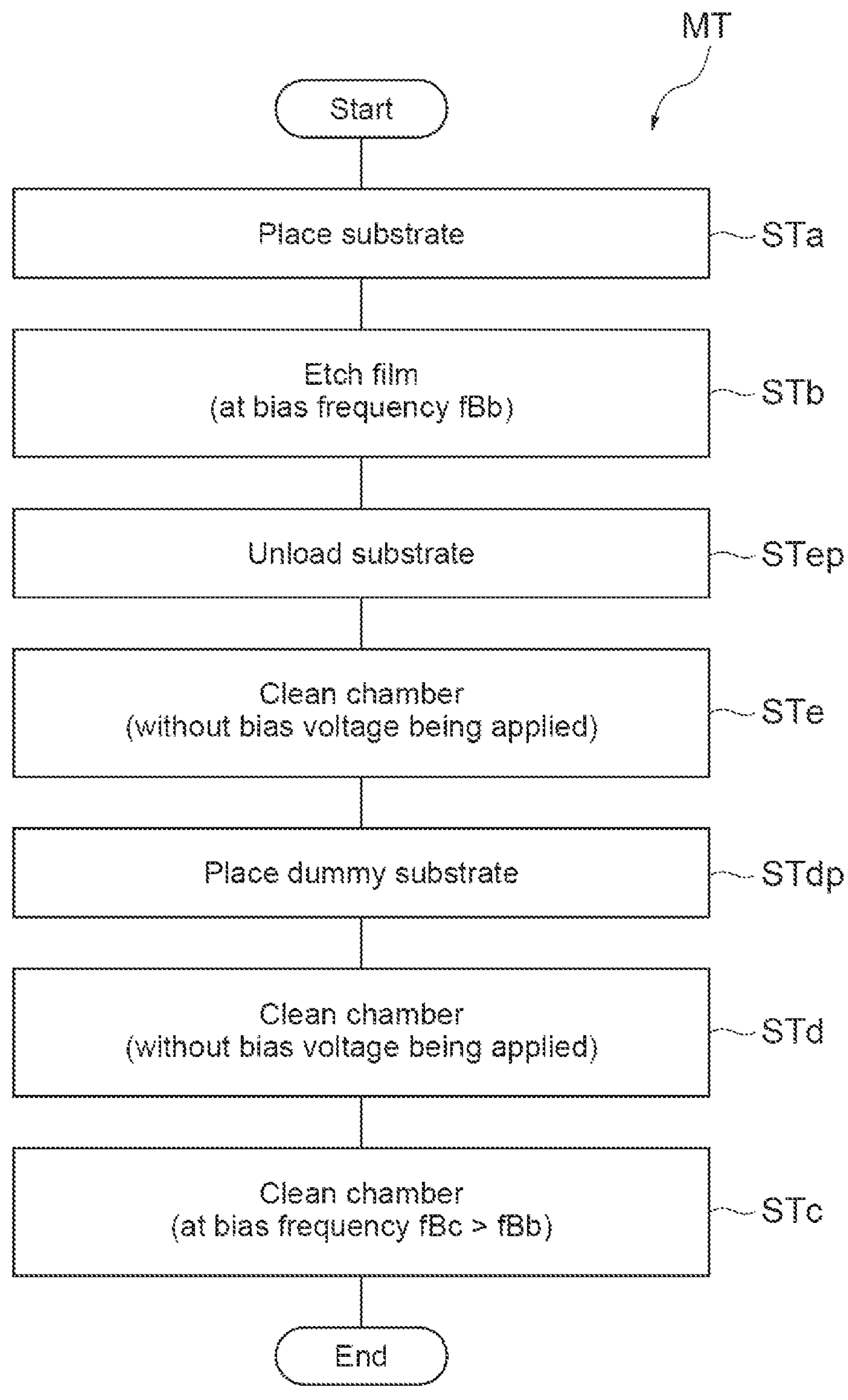
FIG. 1 is a flowchart of a plasma processing method according to one exemplary embodiment.

Exemplary embodiments will now be described in detail with reference to the drawings. In the figures, like reference numerals denote like or corresponding components.

FIG. 1 is a flowchart of a plasma processing method according to one exemplary embodiment. The plasma processing method shown in FIG. 1 (hereafter referred to as a method MT) is performed using a plasma processing apparatus.

Figure 2:
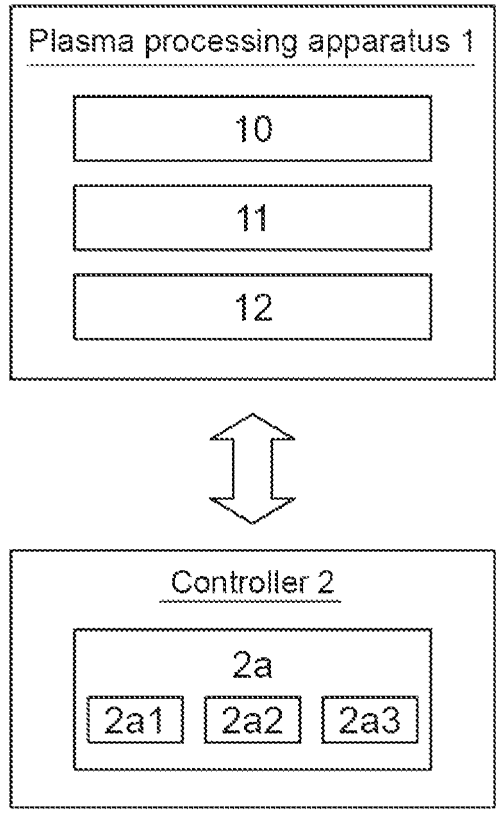
FIG. 2 is a diagram of a plasma processing system with an example structure.

FIG. 2 is a diagram of a plasma processing system with an example structure. In one embodiment, the plasma processing system includes a plasma processing apparatus 1 and a controller 2. The plasma processing system is an example of a substrate processing system. The plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. The plasma processing chamber 10 has at least one gas inlet for receiving at least one process gas supplied into the plasma processing space and at least one gas outlet for discharging the gas from the plasma processing space. The gas inlet is connected to a gas supply 20 (described later). The gas outlet is connected to an exhaust system 40 (described later). The substrate support 11 is located in the plasma processing space and has a substrate support surface for supporting a substrate.

The plasma generator 12 generates plasma from at least one process gas supplied into the plasma processing space. The plasma generated in the plasma processing space may be, for example, capacitively coupled plasma (CCP), inductively coupled plasma (ICP), electron cyclotron resonance (ECR) plasma, helicon wave plasma (HWP), or surface wave plasma (SWP).

The controller 2 processes computer-executable instructions that cause the plasma processing apparatus 1 to perform various steps described in one or more embodiments of the disclosure. The controller 2 may control the components of the plasma processing apparatus 1 to perform the various steps described herein. In one embodiment, some or all of the components of the controller 2 may be included in the plasma processing apparatus 1. The controller 2 may include a processor **2*a*1, a storage 2*a*2, and a communication interface 2*a*3. The controller 2 is implemented by, for example, a computer 2*a*. The processor 2*a*1 may perform various control operations by loading a program from the storage 2*a*2 and executing the loaded program. The program includes computer-executable instructions that cause the plasma processing apparatus 1 to perform various steps included in a control method according to an exemplary embodiment (described later). The program may be prestored in the storage 2*a*2 or may be obtained through a medium as appropriate. The obtained program is stored into the storage 2*a*2 to be loaded from the storage 2*a*2 and executed by the processor 2*a*1. The medium may be one of various storage media readable by the computer 2*a*, or a communication line connected to the communication interface 2*a*3. The processor 2*a*1 may be a central processing unit (CPU). The storage 2*a*2 may include a random-access memory (RAM), a read-only memory (ROM), a hard disk drive (HDD), a solid-state drive (SSD), or a combination of these. The communication interface 2*a*3 may communicate with the plasma processing apparatus 1** through a communication line such as a local area network (LAN).

Figure 3:
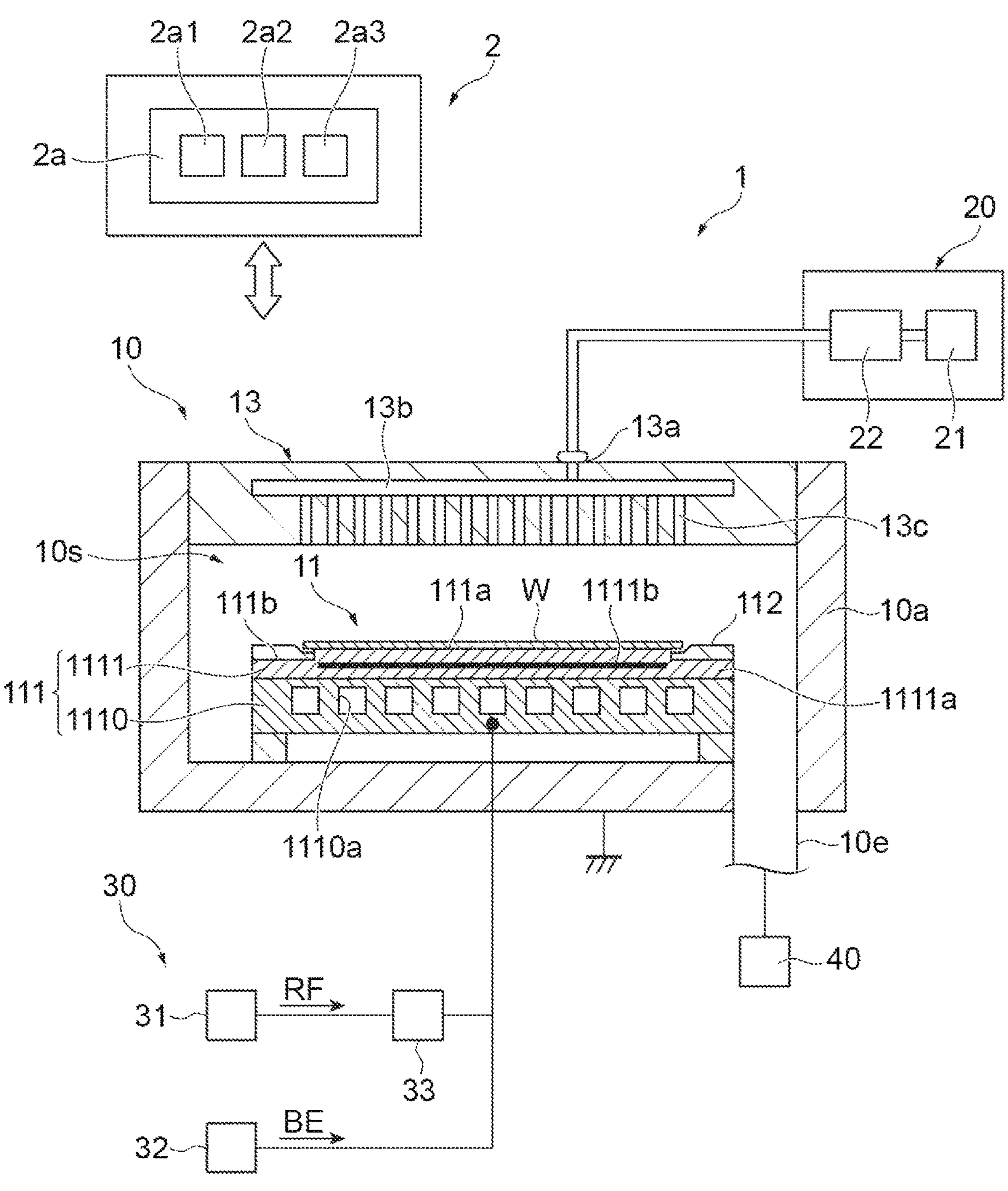
FIG. 3 is a diagram of a capacitively coupled plasma processing apparatus with an example structure.

An example structure of a capacitively coupled plasma processing apparatus as an example of the plasma processing apparatus 1 will now be described. FIG. 3 is a diagram of the capacitively coupled plasma processing apparatus with the structure.

The capacitively coupled plasma processing apparatus 1 includes the plasma processing chamber 10, the gas supply 20, a power supply system 30, and the exhaust system 40. The plasma processing apparatus 1 also includes the substrate support 11 and a gas inlet unit. The gas inlet unit allows at least one process gas to be introduced into the plasma processing chamber 10. The gas inlet unit includes a shower head 13. The substrate support 11 is located in the plasma processing chamber 10. The shower head 13 is located above the substrate support 11. In one embodiment, the shower head 13 defines at least a part of the ceiling of the plasma processing chamber 10. The plasma processing chamber 10 has a plasma processing space 10*s* defined by the shower head 13, a side wall 10*a* of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a body 111 and a ring assembly 112. The body 111 includes a central portion 111*a* for supporting a substrate W and an annular portion 111*b* for supporting the ring assembly 112. The substrate W is, for example, a wafer. The annular portion 111*b* of the body 111 surrounds the central portion 111*a* of the body 111 as viewed in plan. The substrate W is placed on the central portion 111*a* of the body 111. The ring assembly 112 is placed on the annular portion 111*b* of the body 111 to surround the substrate W on the central portion 111*a* of the body 111. Thus, the central portion 111*a* is also referred to as a substrate support surface for supporting the substrate W. The annular portion 111*b* is also referred to as a ring support surface for supporting the ring assembly 112.

In one embodiment, the body 111 includes a base 1110 and an electrostatic chuck (ESC) 1111. The base 1110 includes a conductive member. The ESC 1111 is located on the base 1110. The ESC 1111 includes a ceramic member 1111*a* and an electrostatic electrode 1111*b* inside the ceramic member 1111*a*. The ceramic member 1111*a* includes the central portion 111*a*. In one embodiment, the ceramic member 1111*a* also includes the annular portion 111*b*. The annular portion 111*b* may be included in a separate member surrounding the ESC 1111, such as an annular ESC or an annular insulating member. In this case, the ring assembly 112 may be located on the annular ESC or the annular insulating member, or may be located on both the ESC 1111 and the annular insulating member.

The ring assembly 112 includes one or more annular members. In one embodiment, one or more annular members include one or more edge rings and at least one cover ring. The edge ring is formed from a conductive material or an insulating material. The cover ring is formed from an insulating material.

The substrate support 11 may also include a temperature control module that adjusts at least one of the ESC 1111, the ring assembly 112, or the substrate to a target temperature. The temperature control module may include a heater, a heat transfer medium, a channel 1110*a*, or a combination of these. The channel 1110*a* allows a flow of heat transfer fluid such as brine or gas through it. In one embodiment, the channel 1110*a* is defined in the base 1110, and one or more heaters are located in the ceramic member 1111*a* in the ESC 1111. The substrate support 11 may include a heat transfer gas supply to supply a heat transfer gas into a space between the back surface of the substrate W and the central portion 111*a*.

The shower head 13 introduces at least one process gas from the gas supply 20 into the plasma processing space 10*s*. The shower head 13 has at least one gas inlet 13*a*, at least one gas-diffusion compartment 13*b*, and multiple gas guides 13*c*. The process gas supplied to the gas inlet 13*a* passes through the gas-diffusion compartment 13*b* and is introduced into the plasma processing space 10*s* through the multiple gas guides 13*c*. The shower head 13 also includes at least one upper electrode. In addition to the shower head 13, the gas inlet unit may include one or more side gas injectors (SGIs) installed in one or more openings in the side wall 10*a*.

The gas supply 20 may include at least one gas source 21 and at least one flow controller 22. In one embodiment, the gas supply 20 allows supply of at least one process gas from the corresponding gas source 21 to the shower head 13 through the corresponding flow controller 22. The flow controller 22 may include, for example, a mass flow controller or a pressure-based flow controller. The gas supply 20 may further include at least one flow rate modulator that allows supply of at least one process gas at a modulated flow rate or in a pulsed manner.

The exhaust system 40 is connectable to, for example, a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these.

The power supply system 30 includes a radio-frequency (RF) power supply 31 and a bias power supply 32. The RF power supply 31 serves as the plasma generator 12 in one embodiment. The RF power supply 31 generates source radio-frequency power RF. The source radio-frequency power RF has a source frequency $f_{RF}$. More specifically, the source radio-frequency power RF has a sinusoidal waveform with its frequency being the source frequency $f_{RF}$. The source frequency $f_{RF}$ may be within a range of 10 to 150 MHz. The RF power supply 31 is electrically coupled to an RF electrode through a matcher 33 to provide the source radio-frequency power RF to the RF electrode. The RF electrode may be the conductive member in the base 1110, may be at least one electrode in the ceramic member 1111*a*, or may be the upper electrode. The matcher 33 has a variable impedance that is set to reduce reflection of the source radio-frequency power RF from a load. In response to the source radio-frequency power RF provided to the RF electrode, plasma is generated from the gas in the chamber 10.

The bias power supply 32 generates a bias voltage BE. The bias power supply 32 is electrically coupled to the substrate support 11. The bias power supply 32 is electrically coupled to a bias electrode in the substrate support 11 to cyclically apply the bias voltage BE to the bias electrode. The bias electrode may be the conductive member in the base 1110 or may be at least one electrode in the ceramic member 1111*a*. The bias voltage BE applied to the bias electrode attracts ions in the plasma to the substrate W.

Figure 4:
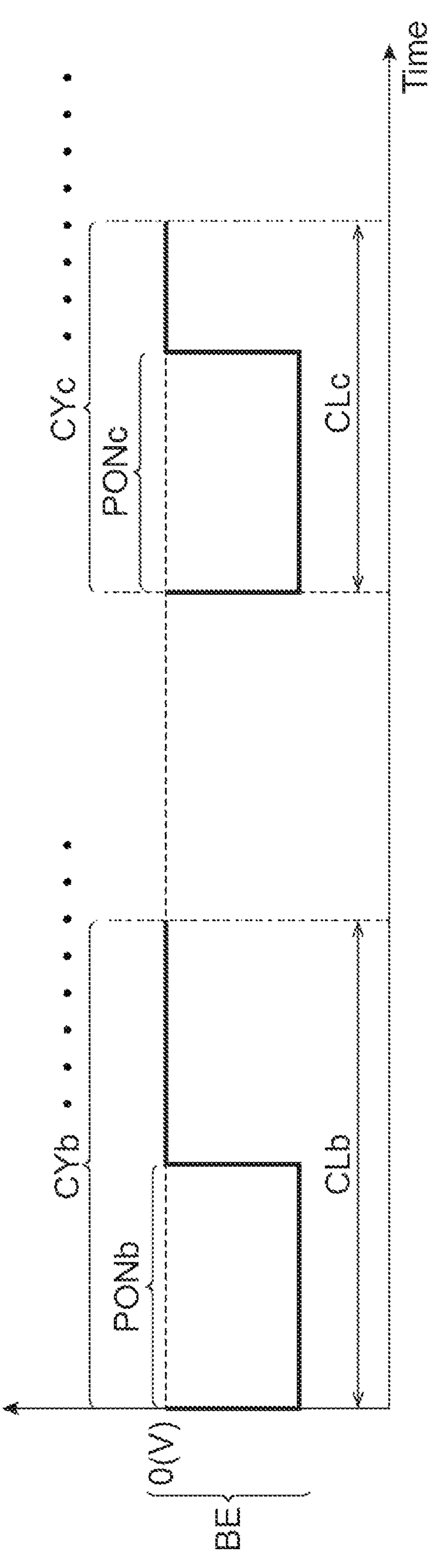
FIG. 4 is a timing chart for a plasma processing apparatus according to one exemplary embodiment.

FIG. 4 will now be referred to in addition to FIG. 3. FIG. 4 is a timing chart for the plasma processing apparatus according to one exemplary embodiment. As shown in FIG. 4, the bias voltage BE has a pulse waveform and is cyclically applied to the bias electrode. The pulse waveform includes voltage pulses. The voltage pulses in the pulse waveform may be pulses of a direct current (DC) voltage. As shown in FIG. 4, the voltage pulses in the pulse waveform may have negative polarity. The pulse waveform of the bias voltage BE may be rectangular, triangular, or in any other shape. The pulse waveform of the bias voltage BE has a waveform cycle (refer to a waveform cycle CYb or a waveform cycle CYc in FIG. 4). The bias voltage BE has a bias frequency being the inverse of the duration of the waveform cycle. The bias frequency is lower than the source frequency. The bias frequency may be set within a range of 100 kHz to 60 MHz.

The method MT will now be described. The plasma processing apparatus 1 will also be described in more detail.

As shown in FIG. 1, the method MT includes steps STa, STb, and STc. The method MT may further include step STd after step STb and before step STc. The method MT may further include step STe after step STb and before step STd.

In step STa in the method MT, the substrate W is placed onto the substrate support surface of the substrate support 11. The substrate support surface is the upper surface of the central portion 111*a* or the ESC 1111.

In step STb, a film on the substrate W is etched. In step STb, plasma is generated from an etching gas in the chamber 10. The film may be a silicon-containing film, such as a silicon oxide film. The etching gas may contain a fluorocarbon gas. The etching gas may further contain at least one of an oxygen-containing gas or a fluorine-containing gas. The oxygen-containing gas may be an oxygen gas ($O_2$ gas). The fluorine-containing gas may be a nitrogen trifluoride gas. In step STb, the film on the substrate W is etched with one or more chemical species, such as ions, radicals, or both, contained in the plasma.

In step STb, the controller 2 controls the gas supply 20, the exhaust system 40, the plasma generator 12 (in one example, the RF power supply 31), and the bias power supply 32. In step STb, the etching gas is supplied into the chamber 10 from the gas supply 20. In step STb, the pressure inside the chamber 10 is set to a specified pressure by the exhaust system 40. In step STb, the plasma generator 12 generates plasma from the etching gas. More specifically, the source radio-frequency power RF provided to the RF electrode from the RF power supply 31 causes plasma to be generated from the etching gas in the chamber 10.

In step STb, the bias voltage BE is cyclically applied from the bias power supply 32 to the bias electrode. The bias frequency of the bias voltage BE in step STb is set to a bias frequency fBb. The bias frequency fBb is the inverse of a duration CLb (refer to FIG. 4) of the waveform cycle CYb in the pulse waveform of the bias voltage BE in step STb. In step STb, the duty cycle of the pulse waveform of the bias voltage BE is set to a duty cycle ODb. The duty cycle ODb is the proportion or the ratio of the duration of a period PONb to the duration CLb of the waveform cycle CYb. The period PONb is a period in which a pulse of the bias voltage BE is output in the waveform cycle CYb.

With the method MT, the substrate W is unloaded from the chamber 10 in step STep after step STb. With the method MT, step STe may then be performed. In step STe, the chamber 10 is cleaned without an object on the substrate support surface. In step STe, plasma is generated from a cleaning gas in the chamber 10 for cleaning. The cleaning gas used in step STe may contain a fluorocarbon gas. The cleaning gas used in step STe may further contain an oxygen-containing gas. The oxygen-containing gas may be an oxygen gas ($O_2$ gas). In step STe, the surfaces inside the chamber 10 are cleaned with one or more chemical species, such as ions, radicals, or both, contained in the plasma.

In step STe, the controller 2 controls the gas supply 20, the exhaust system 40, the plasma generator 12 (in one example, the RF power supply 31), and the bias power supply 32. In step STe, the cleaning gas is supplied into the chamber 10 from the gas supply 20. In step STe, the pressure inside the chamber 10 is set to a specified pressure by the exhaust system 40. In step STe, the plasma generator 12 generates plasma from the cleaning gas. More specifically, the source radio-frequency power RF provided to the RF electrode from the RF power supply 31 causes plasma to be generated from the cleaning gas in the chamber 10. In step STe, the bias power supply 32 may apply no bias voltage BE to the bias electrode.

With the method MT, step STdp is then performed. In step STdp, a dummy substrate is placed onto the substrate support surface. With the method MT, step STd may then be performed. In step STd, the chamber 10 is cleaned with the dummy substrate on the substrate support surface. In step STd, plasma is generated from an oxygen-containing gas in the chamber 10 for cleaning. The oxygen-containing gas may be an oxygen gas ($O_2$ gas). The gas supplied into the chamber 10 in step STd may be the oxygen-containing gas alone. In step STd, the surfaces inside the chamber 10 are cleaned with one or more chemical species, such as ions, radicals, or both, contained in the plasma.

In step STd, the controller 2 controls the gas supply 20, the exhaust system 40, the plasma generator 12 (in one example, the RF power supply 31), and the bias power supply 32. In step STd, the oxygen-containing gas is supplied into the chamber 10 from the gas supply 20. In step STd, the pressure inside the chamber 10 is set to a specified pressure by the exhaust system 40. In step STd, the plasma generator 12 generates plasma from the oxygen-containing gas. More specifically, the source radio-frequency power RF provided to the RF electrode from the RF power supply 31 causes plasma to be generated from the oxygen-containing gas in the chamber 10. In step STd, the bias power supply 32 may apply no bias voltage BE to the bias electrode.

With the method MT, step STc is then performed. In step STc, the chamber 10 is cleaned. Step STc may be performed with the dummy substrate on the substrate support surface. In step STc, plasma is generated from a cleaning gas in the chamber 10. The cleaning gas may contain a fluorocarbon gas, such as a $CF_4$ gas. The cleaning gas may further contain an oxygen-containing gas. The oxygen-containing gas may be an oxygen gas ($O_2$ gas). The cleaning gas may further contain a noble gas. The noble gas may be an argon gas. In step STc, the surfaces inside the chamber 10 are cleaned with one or more chemical species, such as ions, radicals, or both, contained in the plasma.

In step STc, the controller 2 controls the gas supply 20, the exhaust system 40, the plasma generator 12 (in one example, the RF power supply 31), and the bias power supply 32. In step STc, the cleaning gas is supplied into the chamber 10 from the gas supply 20. In step STc, the pressure inside the chamber 10 is set to a specified pressure by the exhaust system 40. In step STc, the plasma generator 12 generates plasma from the cleaning gas. More specifically, the source radio-frequency power RF provided to the RF electrode from the RF power supply 31 causes plasma to be generated from the cleaning gas in the chamber 10.

In step STc, the bias voltage BE is cyclically applied from the bias power supply 32 to the bias electrode. The bias frequency of the bias voltage BE in step STc is set to a bias frequency fBc. The bias frequency fBc is the inverse of a duration CLc (refer to FIG. 4) of the waveform cycle CYc in the pulse waveform of the bias voltage BE in step STc. In step STc, the duty cycle of the pulse waveform of the bias voltage BE is set to a duty cycle ODc. The duty cycle ODc is the proportion or the ratio of the duration of a period PONc to the duration CLc of the waveform cycle CYc. The period PONc is a period in which a pulse of the bias voltage BE is output in the waveform cycle CYc.

In step STc, the bias power supply 32 sets a bias frequency fBc that is higher than the bias frequency fBb in step STb. This improves the performance of removing a substance such as metal adhering to the surfaces inside the chamber 10 through cleaning performed in step STc. The metal may be at least one of aluminum or yttrium. These metals are produced from the surfaces inside the chamber 10 exposed to plasma during etching in step STb and adhere to the surfaces inside the chamber 10.

In step STc, the bias power supply 32 may set a duty cycle ODc that is higher than the duty cycle ODb in step STb. This increases the energy level of ions supplied in step STc to a substance such as metal adhering to the surfaces inside the chamber 10, thus further improving the performance of removing the substance in step STc.

The bias power supply 32 may set a greater absolute value for the voltage level of the pulses of the bias voltage BE in step STc than for the voltage level of the pulses of the bias voltage BE in step STb, in addition to or instead of setting, in step STc, a bias frequency fBc that is higher than the bias frequency fBb.

Although the exemplary embodiments have been described above, the embodiments are not restrictive, and various additions, omissions, substitutions, and changes may be made. The components in the different embodiments may be combined to form another embodiment.

In another embodiment, for example, the plasma processing apparatus may include one or more bias power supplies as described in U.S. Patent Application Publication No. 2021/0074524 (U.S. patent application Ser. No. 17/015,100). The plasma processing apparatus may provide a bias voltage BE serving as bias power from one or more bias power supplies to two or more bias electrodes in the substrate support, as described in the U.S. Patent Application Publication. This plasma processing apparatus may be used with the plasma processing method described above. The entire contents of the U.S. Patent Application are herein incorporated by reference.

A first experiment and a second experiment conducted using the plasma processing apparatus 1 for evaluating the method MT will now be described. In each of the first and second experiments, the method MT was performed with a chip attached to the ring assembly 112. In step STb, a silicon oxide film on a sample substrate was etched with an etching gas containing a fluorocarbon gas, an oxygen gas, and a nitrogen trifluoride gas. In step STe, the chamber 10 was cleaned with a cleaning gas containing a fluorocarbon gas and an oxygen gas without an object on the substrate support surface. In step STd, the chamber 10 was cleaned with an oxygen gas with a dummy substrate on the substrate support surface. In step STc, the chamber 10 was cleaned with a cleaning gas containing a fluorocarbon gas, an argon gas, and an oxygen gas with the dummy substrate on the substrate support surface. The bias frequency fBb in step STb was 400 kHz. In the first experiment, the bias frequency fBc in step STc was set to 400 kHz. In the second experiment, the bias frequency fBc in step STc was set to 600 kHz.

Figure 5:
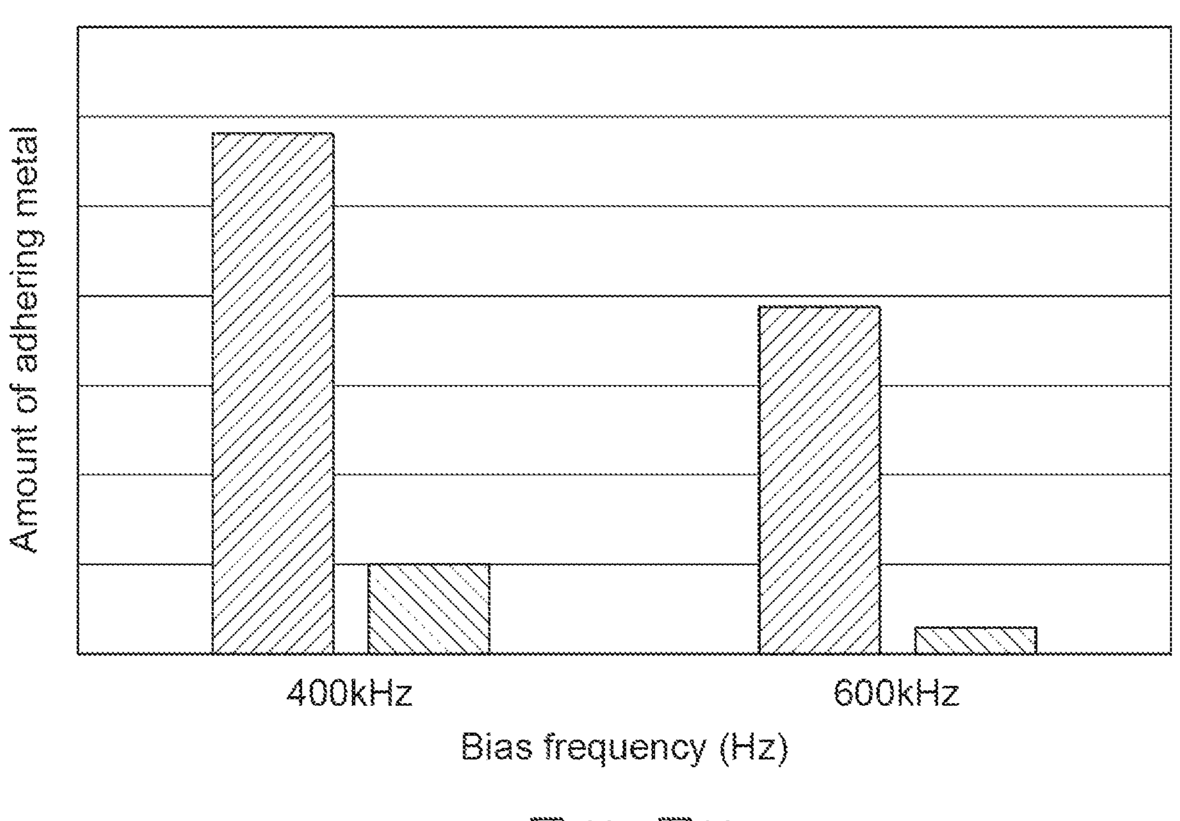
FIG. 5 is a graph showing experimental results.

In the first and second experiments, the amounts of aluminum (Al) and yttrium (Y) adhering to the chip per 1 $cm^2$ after step STc were measured. FIG. 5 shows the results. In FIG. 5, the horizontal axis indicates the bias frequency in step STc, and the vertical axis indicates the amount of metal adhering to the chip per 1 $cm^2$ after step STc. As shown in FIG. 5, the amounts of aluminum and yttrium adhering at the bias frequency of 600 kHz in step STc were smaller than the respective amounts of aluminum and yttrium adhering at the bias frequency of 400 kHz in step STc. The results reveal that setting the bias frequency in step STc to a higher frequency than in step STb improves the performance of removing a substance such as metal adhering to the surfaces inside the chamber 10 through cleaning performed in step STc.

Various exemplary embodiments E1 to E25 included in the disclosure will now be described.

E1

A plasma processing method, comprising:

(a) placing a substrate onto a substrate support surface of a substrate support in a chamber in a plasma processing apparatus;

(b) etching a film on the substrate with plasma generated from an etching gas in the chamber; and (c) cleaning the chamber with plasma generated from a cleaning gas in the chamber, wherein in (b) and (c), a bias voltage including a pulse of a direct current voltage and having a pulse waveform is cyclically applied to a bias electrode in the substrate support, the bias voltage has a bias frequency being an inverse of a duration of a waveform cycle of the pulse waveform, and the bias frequency is higher in (c) than in (b).

E2

The plasma processing method according to claim 1, wherein the bias voltage has a higher duty cycle of the pulse waveform in (c) than in (b).

E3

The plasma processing method according to E1 or E2, wherein each of the etching gas and the cleaning gas contains a fluorocarbon gas.

E4

The plasma processing method according to E3, wherein the cleaning gas further contains an oxygen-containing gas.

E5

The plasma processing method according to any one of E1 to E4, further comprising:

(d) cleaning, between (b) and (c), the chamber with plasma generated from an oxygen-containing gas in the chamber with a dummy substrate on the substrate support, wherein (d) is performed without the bias voltage applied to the bias electrode.

E6

The plasma processing method according to E5, further comprising:

(e) cleaning, between (b) and (d), the chamber with plasma generated from an other cleaning gas in the chamber without an object on the substrate support surface.

E7

The plasma processing method according to E6, wherein (e) is performed without the bias voltage applied to the bias electrode.

E8

The plasma processing method according to E6 or E7, wherein the other cleaning gas contains a fluorocarbon gas.

E9

The plasma processing method according to E8, wherein the other cleaning gas further contains an oxygen-containing gas.

E10

The plasma processing method according to any one of E1 to E9, wherein (c) is performed with a dummy substrate on the substrate support surface.

E11

The plasma processing method according to any one of E1 to E10, wherein the pulse of the direct current voltage has negative polarity.

E12

The plasma processing method according to any one of E1 to E11, wherein a voltage level of the pulse of the direct current voltage has a greater absolute value in (c) than in (b).

E13

A plasma processing apparatus, comprising:

a chamber;

a substrate support in the chamber, the substrate support including a substrate support surface and a bias electrode;

a gas supply configured to supply a gas into the chamber;

a plasma generator configured to generate plasma in the chamber;

a bias power supply configured to cyclically apply a bias voltage including a pulse of a direct current voltage and having a pulse waveform to the bias electrode, the bias voltage having a bias frequency being an inverse of a duration of a waveform cycle of the pulse waveform; and a controller configured to control the gas supply, the plasma generator, and the bias power supply, wherein the controller performs operations including (b) controlling the gas supply, the plasma generator, and the bias power supply to generate plasma from an etching gas in the chamber and etch a film on a substrate on the substrate support, and (c) controlling the gas supply, the plasma generator, and the bias power supply to generate plasma from a cleaning gas in the chamber to clean the chamber, and the bias power supply cyclically applies the bias voltage to the bias electrode in (b) and (c), and sets the bias frequency higher in (c) than in (b).

E14

The plasma processing apparatus according to E13, wherein the bias power supply sets a higher duty cycle for the pulse waveform of the bias voltage in (c) than in (b).

E15

The plasma processing apparatus according to E13 or E14, wherein each of the etching gas and the cleaning gas contains a fluorocarbon gas.

E16

The plasma processing apparatus according to E15, wherein the cleaning gas further contains an oxygen-containing gas.

E17

The plasma processing apparatus according to any one of E13 to E16, wherein the controller performs operations including (d) controlling, between (b) and (c), the gas supply and the bias power supply to generate plasma from an oxygen-containing gas in the chamber to clean the chamber with a dummy substrate on the substrate support, and (d) is performed without the bias voltage applied to the bias electrode by the bias power supply.

E18

The plasma processing apparatus according to E17, wherein the controller performs operations including (e) controlling, between (b) and (d), the gas supply and the bias power supply to generate plasma from an other cleaning gas in the chamber to clean the chamber without an object on the substrate support surface.

E19

The plasma processing apparatus according to E18, wherein (e) is performed without the bias voltage applied to the bias electrode by the bias power supply.

E20

The plasma processing apparatus according to E18 or E19, wherein the other cleaning gas contains a fluorocarbon gas.

E21

The plasma processing apparatus according to E20, wherein the other cleaning gas further contains an oxygen-containing gas.

E22

The plasma processing apparatus according to any one of E13 to E21, wherein (c) is performed with a dummy substrate on the substrate support surface.

E23

The plasma processing apparatus according to any one of E13 to E22, wherein the pulse of the direct current voltage has negative polarity.

E24

The plasma processing apparatus according to any one of E13 to E23, wherein the bias power supply sets a greater absolute value for a voltage level of the pulse of the direct current voltage in (c) than in (b).

E25

A plasma processing apparatus, comprising:

a chamber;

a substrate support in the chamber, the substrate support including a substrate support surface and a bias electrode;

a gas supply configured to supply a gas into the chamber;

a plasma generator configured to generate plasma in the chamber;

a bias power supply configured to cyclically apply a bias voltage including a pulse of a direct current voltage and having a pulse waveform to the bias electrode, the bias voltage having a bias frequency being an inverse of a duration of a waveform cycle of the pulse waveform; and a controller configured to control the gas supply, the plasma generator, and the bias power supply, wherein the controller performs operations including (b) controlling the gas supply, the plasma generator, and the bias power supply to generate plasma from an etching gas in the chamber and etch a film on a substrate on the substrate support, and (c) controlling the gas supply, the plasma generator, and the bias power supply to generate plasma from a cleaning gas in the chamber to clean the chamber, and the bias power supply cyclically applies the bias voltage to the bias electrode in (b) and (c), and sets a greater absolute value for a voltage level of the pulse of the direct current voltage in (c) than in (b).

The exemplary embodiments according to the disclosure have been described by way of example, and various changes may be made without departing from the scope and spirit of the disclosure. The exemplary embodiments disclosed above are thus not restrictive, and the true scope and spirit of the disclosure are defined by the appended claims.

What is claimed is:

1. A plasma processing apparatus, comprising:

a chamber;

a substrate support in the chamber, the substrate support including a substrate support surface and a bias electrode;

a gas supply configured to supply a gas into the chamber;

a plasma generator configured to generate plasma in the chamber;

a bias power supply configured to cyclically apply a bias voltage including a pulse of a direct current voltage and having a pulse waveform to the bias electrode, the bias voltage having a bias frequency being an inverse of a duration of a waveform cycle of the pulse waveform; and a controller configured to control the gas supply, the plasma generator, and the bias power supply, wherein the controller performs operations including (b) controlling the gas supply, the plasma generator, and the bias power supply to generate plasma from an etching gas in the chamber and etch a film on a substrate on the substrate support, and (c) controlling the gas supply, the plasma generator, and the bias power supply to generate plasma from a cleaning gas in the chamber to clean the chamber, and the bias power supply cyclically applies the bias voltage to the bias electrode in (b) and (c), and sets the bias frequency higher in (c) than in (b).

2. The plasma processing apparatus according to claim 1, wherein the bias power supply sets a higher duty cycle for the pulse waveform of the bias voltage in (c) than in (b).

3. The plasma processing apparatus according to claim 1, wherein each of the etching gas and the cleaning gas contains a fluorocarbon gas.

4. The plasma processing apparatus according to claim 3, wherein the cleaning gas further contains an oxygen-containing gas.

5. The plasma processing apparatus according to claim 1, wherein the controller performs operations including (d) controlling, between (b) and (c), the gas supply and the bias power supply to generate plasma from an oxygen-containing gas in the chamber to clean the chamber with a dummy substrate on the substrate support, and (d) is performed without the bias voltage applied to the bias electrode by the bias power supply.

6. The plasma processing apparatus according to claim 5, wherein the controller performs operations including (e) controlling, between (b) and (d), the gas supply and the bias power supply to generate plasma from an other cleaning gas in the chamber to clean the chamber without an object on the substrate support surface.

7. The plasma processing apparatus according to claim 6, wherein (e) is performed without the bias voltage applied to the bias electrode by the bias power supply.

8. The plasma processing apparatus according to claim 6, wherein the other cleaning gas contains a fluorocarbon gas.

9. The plasma processing apparatus according to claim 8, wherein the other cleaning gas further contains an oxygen-containing gas.

10. The plasma processing apparatus according to claim 1, wherein (c) is performed with a dummy substrate on the substrate support surface.

11. The plasma processing apparatus according to claim 1, wherein the pulse of the direct current voltage has negative polarity.

12. The plasma processing apparatus according to claim 1, wherein the bias power supply sets a greater absolute value for a voltage level of the pulse of the direct current voltage in (c) than in (b).

13. A plasma processing apparatus, comprising:

a chamber;

a substrate support in the chamber, the substrate support including a substrate support surface and a bias electrode;

a gas supply configured to supply a gas into the chamber;

a plasma generator configured to generate plasma in the chamber;

a bias power supply configured to cyclically apply a bias voltage including a pulse of a direct current voltage and having a pulse waveform to the bias electrode, the bias voltage having a bias frequency being an inverse of a duration of a waveform cycle of the pulse waveform; and a controller configured to control the gas supply, the plasma generator, and the bias power supply, wherein the controller performs operations including (b) controlling the gas supply, the plasma generator, and the bias power supply to generate plasma from an etching gas in the chamber and etch a film on a substrate on the substrate support, and (c) controlling the gas supply, the plasma generator, and the bias power supply to generate plasma from a cleaning gas in the chamber to clean the chamber, and the bias power supply cyclically applies the bias voltage to the bias electrode in (b) and (c), and sets a greater absolute value for a voltage level of the pulse of the direct current voltage in (c) than in (b).

* * * * *